Sept. 24, 1963 P. R. AIGRAIN ET AL 3,105,177
SEMICONDUCTIVE DEVICE UTILIZING QUANTUM-MECHANICAL TUNNELING
Filed Nov. 23, 1959
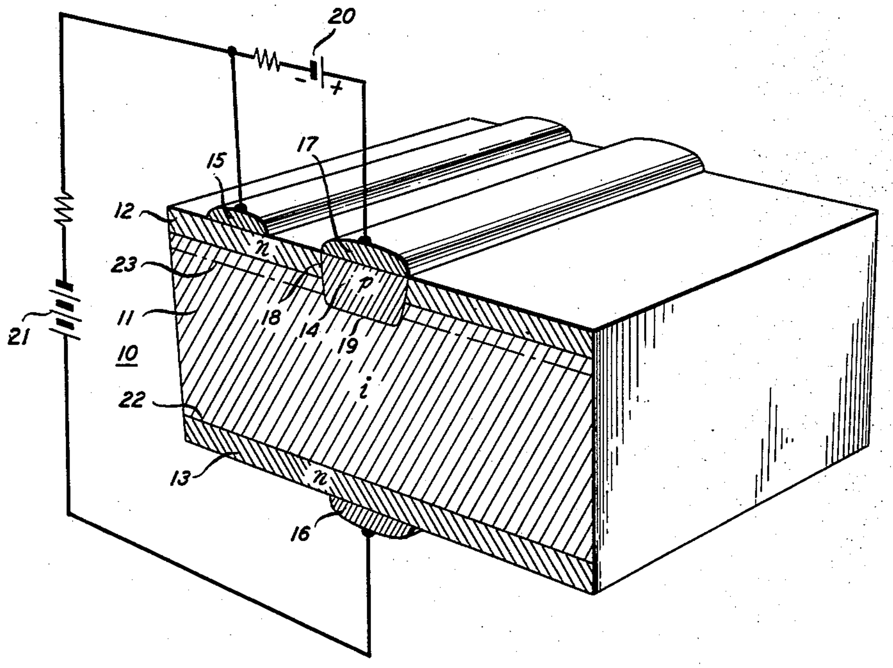
INVENTORS: P. R. AIGRAIN
A. G. CHYNOWETH
BY A. J. Torsiglieri
ATTORNEY

United States Patent Office 3,105,177

Patented Sept. 24, 1963

3,105,177

SEMICONDUCTIVE DEVICE UTILIZING QUANTUM-MECHANICAL TUNNELING

Pierre R. Aigrain, Paris, France, and Alan G. Chynoweth, Summit, N.J., assignors to Bell Telephone Laboratories, Incorporated, New York, N.Y., a corporation of New York Filed Nov. 23, 1959, Ser. No. 854,802
1 Claim. (Cl. 317—234)

This invention relates to semiconductive devices and their fabrication.

There is currently considerable interest in a semiconductive device of the kind known as an Esaki or tunnel diode which includes a narrow rectifying junction between two degenerate regions such that quantum mechanical tunneling through the junction by conduction band electrons to unoccupied valence band states results in a negative resistance when the junction is forward biased an appropriate amount. Such a diode is of special interest for use at very high frequencies.

For usefulness at high frequencies, it is important to keep small the capacitance associated with the active rectifying junction. Realization of a small capacitance is furthered by a small area junction.

An object of the present invention is a tunnel diode having a small area active junction which can be made conveniently and which is readily reproduced.

A feature of the invention is a wafer which includes a first degenerate surface layer which is separated from the rest of the wafer by a rectifying junction which consists of two parts. The first part which is the active, or useful part, separates the first surface layer from a second degenerate surface layer of the opposite conductivity type. The second part, which is the inactive or useless part, separates the first surface layer from the high resistivity interior of the wafer. With such a geometry the area of the active part of the junction, the effective area of the Esaki diode, is readily and reproducibly controlled by the thickness of the second degenerate layer. This second layer advantageously is formed by solid-state diffusion to achieve a high degree of control.

Advantageously, provision is made for establishing an electric field in the wafer for providing a space charge layer to reduce the injection current across the inactive portion of the rectifying junction. Such injection current undesirably masks the desired tunneling current through the active portion of the junction.

In a preferred embodiment in accordance with the invention, a silicon wafer whose bulk is substantially intrinsic includes on each of two opposite surfaces a degenerate layer of like conductivity type. Additionally, the wafer includes on one of such two surfaces a localized deeper degenerate layer of opposite conductivity type which penetrates through to the intrinsic interior. Electrode connections are provided to each of the three degenerate layers.

The invention will be better understood from the following more detailed description, taken in conjunction with the accompanying drawing, showing in perspective a semiconductive device in accordance with the invention.

With reference now to the drawing, the device 10 illustrated comprises a monocrystalline silicon wafer whose bulk interior 11 is substantially intrinsic, i.e., high resistivity material, either p- or n-type. The wafer also includes on opposite surfaces degenerate n-type layers 12 and 13. As is customary in the art, a degenerate semiconductive layer is defined as one in which the Fermi level is not in the band gap but rather in the conduction band for n-type material and in the valence band for p-type material. Additionally, one surface further includes a localized degenerate p-type layer 14 which extends beyond the depth of layer 12 in penetrating to the intrinsic interior portion. Electrodes 15, 16 and 17 make low resistance connections to the layers 12, 13 and 14, respectively.

The p-type layer 14 is enclosed by a rectifying junction which includes the portion 18 separating it from layer 12 and the portion 19 separating it from the intrinsic bulk. The portion 18 is a p-n junction, while the portion 19 forms a p-i-n junction with respect to layer 12. Voltage source 20 is connected between electrodes 15 and 17 and is poled to bias the junction portion 18 in the forward direction.

It is evident that between electrodes 15 and 17 two possible current paths exist.

The first current path is by way of the p-n junction 18. By making the junction 18 sufficiently abrupt, this current path can be made to serve effectively as an Esaki diode, the change in tunneling current across the junction with changing forward bias resulting in the characteristic negative resistance effect.

The second current path is by way of the p-i-n junction 19. The current in this path desirably should be small for a forward bias between electrodes 15 and 17 so as not to mask the tunneling current in the other path. This current will tend to be small because of the presence of the intrinsic portion. This current can be made still smaller by the insertion of voltage source 21 between electrodes 15 and 16 to bias in reverse the junction 22 extending between layer 13 and the bulk 11 such that the space charge layer whose limit is shown by the broken line 23 extends into the bulk beyond the major planar portion of the junction 19. This has the effect of making the bias across such junction 19 independent of the voltage applied between electrodes 15 and 17 so that a reverse bias may be applied across the junction 19, while a forward bias is maintained across the junction 18. As a consequence, the current flowing between electrodes 15 and 17 can be made to pass almost entirely only through the junction 18.

An important advantage of the geometry disclosed is that the height of the junction 18 is fixed by the thickness of layer 12. Since the layer 12 may readily be made to have a small thickness, for example, of several microns, the height of the junction 18 and consequently its area, can be controlled appropriately.

The invention is of special advantage for providing an Ezaki diode which has a line geometry as shown in the FIGURE. With such a line geometry, where the junction has a length which is long, to keep the junction area small it is important that the height of the junction be small.

In operation, the electrode 17 is biased positively with respect to electrode 15 an appropriate amount for the desired negative resistance to be achieved. This typically is a fraction of a volt. Additionally, the electrode 17 is biased negatively with respect to the electrode 16 to establish a reverse bias on the junction 22. A voltage of at least several tens of volts is usually required for this purpose.

It is, of course, obvious that a complementary design is feasible in which p-type regions are substituted for n-type regions and vice versa. In this case, the polarities of the voltages applied to the various electrodes need to be reversed.

The device described also has special application in modulation arrangements since the properties of the device, particularly the value of the negative resistance, can be varied by the application of modulating information on the third electrode 16 to vary the depth of penetration of the space charge layer. Voltage source 21 is shown as variable by way of illustration.

Known techniques can be used for fabricating the device described.

Typically, a diode of the kind described may be made as follows: There is first prepared a monocrystalline silicon wafer of relatively high specific resistivity, advantageously at least 50 ohm-centimeters. The wafer is cut to have a thickness of ten mils and major faces 50 by 500 mils. The wafer is then heated in an atmosphere of phosphorus pentoxide at a temperature and for a time suitable for diffusing phosphorus into the wafer and forming a degenerate n-type layer several microns thick over the surface of the body. The edges are etched to remove the phosphorous-diffused material shorting together the phosphorous-diffused layers on opposite major faces. Thereafter, a strip of 3.5 mil aluminum-boron wire (.75 percent boron) is laid along the long dimension of one major surface side by side and separated by twenty mils with a strip of 3.5 mil gold-antimony wire (.1 percent antimony), and the wires are alloyed into the wafer. The regrowth region associated with the alloying of the aluminum-boron wire forms the p-type layer 14 and the aluminum-boron-silicon eutectic overlying the regrowth region forms the metallic electrode 17. The gold-antimony-silicon eutectic forms the metallic electrode 16.

A gold-antimony wire is alloyed to the layer 13 on the opposite major surface to form the metallic electrode 16.

It can readily be appreciated that the device shown can be fabricated in various other ways.

It is also evident that various modifications can be made in the device described without departing from the spirit and scope of the invention. In particular, other semiconductors, such as germanium and intermetallic group III–group V compounds, may be used. Moreover, any appropriate impurities may be used for forming the various layers.

Additionally, the various degenerate zones may have configurations other than those shown.

Moreover, in some instances satisfactory operation is possible without the application of an applied voltage on the electrode 16. When this is the case, it and the degenerate layer 13 are superfluous and can be eliminated from the design. Additionally, by forming an electrode connection to the layer 12 symmetrical with electrode 15 about the zone 14, there results between such additional electrode and electrode 15 an NPN structure characterized by a pair of rectifying junctions each of which can provide a negative resistance.

What is claimed is:

A semiconductive device comprising a semiconductive wafer having on opposite surfaces first and second relatively large area degenerate zones of one conductivity type and a substantially intrinsic layer intermediate between said zones, one of said two opposite surfaces also including a relatively small area degenerate zone of the opposite conductivity type which extends completely through the relatively large area zone on said surface to the substantially intrinsic intermediate layer, the interface between said relatively small area zone and the relatively large area zone being a p-n junction adaptable for quantum-mechanical tunneling therethrough, the substantially intrinsic intermediate layer being substantially thicker than any of the degenerate zones, and a separate electrode connection to each of the three degenerate zones.

References Cited in the file of this patent

UNITED STATES PATENTS

| | | |
|---|---|---|
| 2,740,076 | Matthews et al. | Mar. 27, 1956 |
| 2,861,018 | Fuller et al. | Nov. 18, 1958 |
| 2,861,229 | Pankove | Nov. 18, 1958 |
| 2,895,109 | Weinreich | July 14, 1959 |
| 2,899,343 | Statz | Aug. 11, 1959 |
| 2,959,505 | Riesz | Nov. 8, 1960 |
| 3,033,714 | Ezaki et al. | May 8, 1962 |

FOREIGN PATENTS

| | | |
|---|---|---|
| 1,193,425 | France | Apr. 27, 1959 |

OTHER REFERENCES

Early: Bell System Technical Journal, article, May 1954, vol. 33, No. 3, pp. 517 to 533.